(12) United States Patent
Tokiwa

(10) Patent No.: US 8,263,224 B2
(45) Date of Patent: Sep. 11, 2012

(54) RESIN COMPOSITION

(75) Inventor: Tetsuji Tokiwa, Tokyo (JP)

(73) Assignee: Asahi Kasei Chemicals Corporation, Tokyo (JP)

( * ) Notice: Subject to any disclaimer, the term of this patent is extended or adjusted under 35 U.S.C. 154(b) by 547 days.

(21) Appl. No.: 12/446,866

(22) PCT Filed: Nov. 28, 2007

(86) PCT No.: PCT/JP2007/072903
§ 371 (c)(1),
(2), (4) Date: Apr. 23, 2009

(87) PCT Pub. No.: WO2008/069059
PCT Pub. Date: Jun. 12, 2008

(65) Prior Publication Data
US 2009/0266604 A1    Oct. 29, 2009

(30) Foreign Application Priority Data
Nov. 29, 2006   (JP) .................................. 2006-321145

(51) Int. Cl.
*H01F 1/04* (2006.01)
*C08L 27/18* (2006.01)

(52) U.S. Cl. .................. 428/407; 252/62.54; 252/62.55; 252/62.59; 252/62.63; 428/421; 524/413; 524/431; 524/435; 524/436; 524/544; 524/545; 524/546

(58) Field of Classification Search .................. 524/431, 524/435, 436, 544–546; 252/62.55, 62.59, 252/62.63
See application file for complete search history.

(56) References Cited

U.S. PATENT DOCUMENTS

| 4,277,586 | A | * | 7/1981 | Ukihashi et al. ................. 526/93 |
| 4,698,182 | A | * | 10/1987 | Nagai et al. ................. 252/62.59 |
| 4,714,654 | A | * | 12/1987 | Ito et al. ......................... 428/328 |
| 4,781,852 | A | * | 11/1988 | Kaczur et al. .............. 252/62.59 |
| 5,616,414 | A | * | 4/1997 | Hopstock et al. ............. 428/402 |
| 6,695,985 | B2 | * | 2/2004 | Igarashi et al. ............ 252/518.1 |
| 2004/0054029 | A1 | | 3/2004 | Fujiki et al. |
| 2004/0075075 | A1 | * | 4/2004 | Takada et al. .............. 252/62.63 |

FOREIGN PATENT DOCUMENTS

| DE | 10146805 A1 | 5/2003 |
| EP | 0496112 A2 | 7/1992 |
| EP | 1372162 A1 | 12/2003 |
| EP | 1610608 A1 | 12/2005 |
| JP | 63-12106 A | 1/1988 |

(Continued)

OTHER PUBLICATIONS

Nakamura et al. "Complex Permeability of Polycrystalline Hexagonal Ferrites", IEEE Transactions on Magnetics, Sep. 2000, vol. 36, pp. 3415-3417.*

(Continued)

*Primary Examiner* — Mark Eashoo
*Assistant Examiner* — Nicole M Buie-Hatcher
(74) *Attorney, Agent, or Firm* — Birch, Stewart, Kolasch & Birch, LLP

(57) ABSTRACT

Disclosed is a resin composition containing a hexagonal ferrite and a resin, which is characterized in that the hexagonal ferrite is contained in an amount of 50-98 parts by weight per 100 parts by weight of the total of the resin composition.

14 Claims, 1 Drawing Sheet

FOREIGN PATENT DOCUMENTS

| | | |
|---|---|---|
| JP | 4-198233 A | 7/1992 |
| JP | 2000-228304 A | 8/2000 |
| JP | 2002-280207 A | 9/2002 |
| JP | 2003-332784 A | 11/2003 |
| JP | 2005-19846 A | 1/2005 |
| JP | 2006-128280 A | 5/2006 |
| JP | 2006-137653 A | 6/2006 |
| KR | 0504591 B1 | 8/2005 |

OTHER PUBLICATIONS

Korean Office Action issued on Feb. 16, 2011 in corresponding Korean Patent Application No. 10-2009-7005995.

Database WPI, Week 200637, Thomson Scientific, London, GB; AN 2006-355899 (JP-2006-128280-A), 2006, XP002625743.

European Search Report dated Mar. 29, 2011 for Application No. 07832625.3.

* cited by examiner

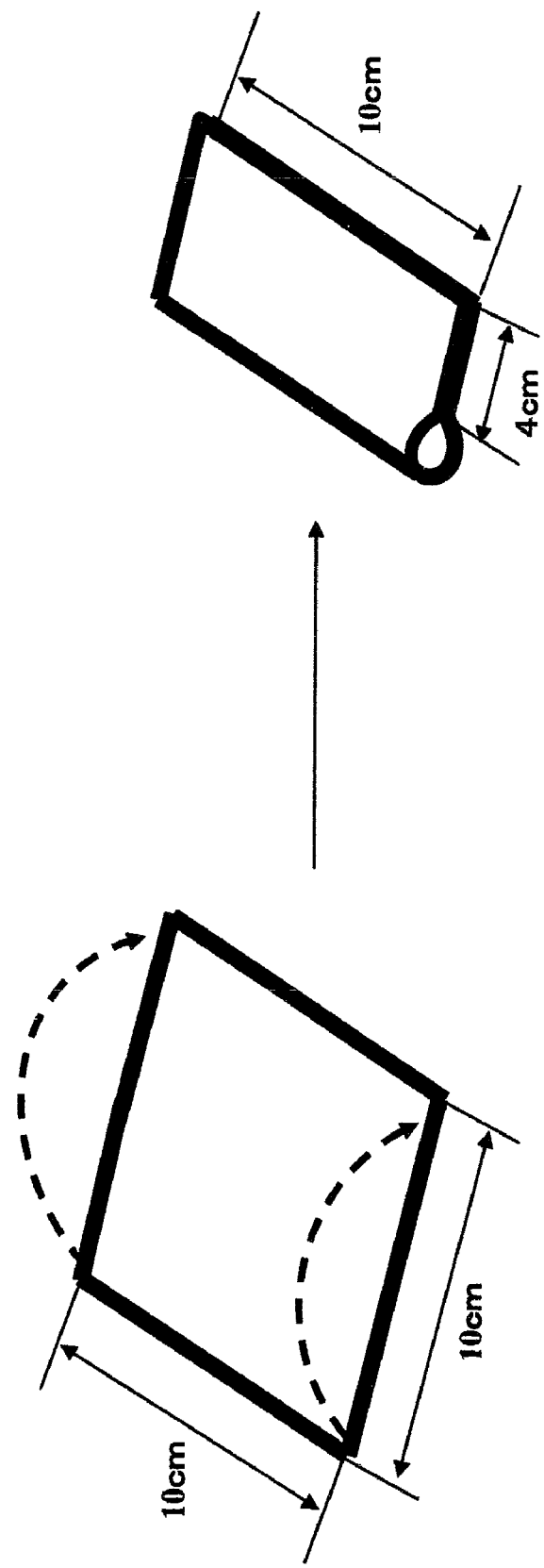

RESIN COMPOSITION

TECHNICAL FIELD

The present invention relates to an electromagnetic wave absorbing material composed of a magnetic powder and a resin.

The present invention particularly relates to an electromagnetic wave absorbing material having excellent electromagnetic wave absorption properties in a high frequency region.

BACKGROUND ART

Generally, electronic members, such as wiring portions and CPUs, in electronic circuits generate electromagnetic waves, and the electromagnetic waves may affect other electronic members and result in malfunction. Also, when an electromagnetic wave is transmitted and received in information communication, unnecessary electromagnetic waves other than the intended electromagnetic wave interfere, so that the transmission and reception of the electromagnetic wave may be hindered.

As means for absorbing such unnecessary electromagnetic waves to prevent the malfunction of electronic equipment and the failure of information communication, methods using composite materials in which a magnetic material, such as metal fine particles and a ferrite, is compounded in a resin, have been conventionally known (for example, see Patent Document 1). However, in recent years, with higher speed and larger capacity in information communication, the alternating current frequency of electronic circuits in personal computers, cellular phones, DVDs, and the like, and the electromagnetic wave frequency used in information communication have been increasing, and effective electromagnetic wave absorption may have been difficult with conventionally used ferrites and soft magnetic metals. Also, new information communication technology using electromagnetic waves in the high frequency region is being developed. Here, the high frequency region refers to a region of more than 1 GHz. For example, in the field of image technology, methods, in which image information is transmitted in a space to image equipment by a high frequency electromagnetic wave without a cable and displayed, have also been developed. In automobile communication equipment, systems, in which other automobiles and obstacles ahead of an automobile are detected by an electromagnetic wave in the millimeter wave region to prevent collision, have been developed. The number of cases where electromagnetic waves in the high frequency region, which have been seldom used conventionally, are used in this manner has been increasing. However, a material that can prevent the malfunction of electronic equipment for transmitting and receiving these electromagnetic waves, and its peripheral equipment, and can simply and effectively prevent communication failure due to reflected waves, and the like has not been obtained.

Patent Document 1: JP-A-2005-19846

DISCLOSURE OF THE INVENTION

Problems to be Solved by the Invention

It is an object of the present invention to provide a material that effectively absorbs unnecessary electromagnetic waves in a high frequency region.

Means for Solving the Problems

As a result of diligently studying compositions of magnetic powders and resins to solve the above problems, the present inventor has found that a composition in which a hexagonal ferrite is mixed in a resin exhibits excellent radio wave absorption effect at a high frequency of 1 GHz or more, arriving at the present invention.

The present invention is (1) a resin composition comprising a hexagonal ferrite and a resin, characterized in that the resin composition comprises 50 to 98 parts by weight of the hexagonal ferrite, based on 100 parts by weight of a total amount of the resin composition, (2) the resin composition according to (1), comprising 90 to 95 parts by weight of the hexagonal ferrite, (3) the resin composition according to (1) or (2), wherein the resin is a fluororesin having a fluorine atom in a polymer molecular chain, (4) the resin composition according to (3), wherein the fluororesin is at least one selected from tetrafluoroethylene, perfluoroalkoxyalkane, a perfluoroethylene-propene copolymer, an ethylene-tetrafluoroethylene copolymer, polyvinylidene fluoride, polychlorotrifluoroethylene, an ethylene-chlorofluoroethylene copolymer, a tetrafluoroethylene-perfluorodioxole copolymer, polyvinylidene fluoride, and a tetrafluoroethylene-propylene copolymer, (5) the resin composition according to (4), wherein the fluororesin is a tetrafluoroethylene-propylene copolymer, (6) the resin composition according to (5), wherein a proportion of a number of propylene units to a total number of monomer units in the tetrafluoroethylene-propylene copolymer is 30 to 50%, (7) the resin composition according to (5) or (6), wherein a Mooney viscosity of the tetrafluoroethylene-propylene copolymer is 20 to 50 ML (1+10) 100° C., (8) the resin composition according to (1), wherein the hexagonal ferrite is one or a mixture of two or more selected from the group consisting of an M-type, a Z-type, and a Y-type having the following general formulas:

(M-type) $BaM_XFe_{(12-X)}O_{19}$
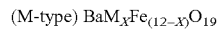

(Z-type) $Ba_3M_\beta Fe_{24}O_{41}$

(Y-type) $Ba_2M_2Fe_{12}O_{22}$
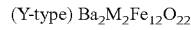

wherein, M is one or a combination of two or more selected from the group consisting of Ti, Co, Ni, Zn, Mn, and Cu, and part or all of Ba may be substituted with Sr, and wherein in the formula of the M-type, X is an integer of 0 to 12, and in the formula of the Z-type, β is 0.1 to 20, (9) the resin composition according to (8), wherein when the resin composition comprises the M-type as the hexagonal ferrite, a condition of $1.0 \leq \alpha \leq 6.4$ is satisfied, provided that a molar ratio of a Fe component to an M component in the M-type is represented by Fe component:M component=10:α,

(10) the resin composition according to (8) or (9), wherein when the resin composition comprises the M-type as the hexagonal ferrite, the M-type is $Ba(Ti_4Co_BZn_C)_2Fe_{10}O_{19}$, and conditions of $0.3 \leq A \leq 1.5$, $0.1 \leq B \leq 1.0$, and $0.1 \leq C \leq 0.7$ are satisfied,

(11) the resin composition according to (8), wherein when the resin composition comprises the Z-type as the hexagonal ferrite, a condition of $0.5 \leq \beta \leq 2.6$ is satisfied, provided that a molar ratio of a Fe component to an M component in the Z-type is represented by Fe component:M component=24:β,

(12) the resin composition according to (8) or (11), wherein when the resin composition comprises the Z-type as the hexagonal ferrite, the Z-type is $Ba_3Co_DZn_EFe_{24}O_{41}$, and conditions of $0.4 \leq D \leq 2.0$ and $0.1 \leq E \leq 1.0$ are satisfied,

(13) the resin composition according to (8), wherein when the resin composition comprises the Y-type as the hexagonal ferrite, the Y-type is $Ba_2(Zn_F)_2Fe_{12}O_{22}$, and a condition of $0.35 \leq F \leq 1.35$ is satisfied,

(14) the resin composition according to any one of (1) to (13), comprising 2 to 47 parts by weight of the resin, 50 to 95 parts by weight of the hexagonal ferrite, and 3 to 48 parts by weight of one or a mixture comprising a combination of two or more selected from the group consisting of a soft magnetic ferrite, a soft magnetic alloy, a highly thermally conductive inorganic substance, and an electrically conductive substance, based on 100 parts by weight of the total amount of the resin composition,

(15) a sheet comprising the resin composition according to any one of (1) to (14),

(16) an adhesive sheet having an adhesive layer on a surface of the sheet according to (15),

(17) a paint containing the resin composition according to any one of (1) to (14),

(18) a sheet for electromagnetic wave absorption having a layer comprising the paint according to (17) on a surface of a sheet of a resin, and

(19) the sheet according to any one of (15), (16), and (18), used for absorbing an electromagnetic wave generated from a circuit of an electrical product and electronic equipment.

ADVANTAGE OF THE INVENTION

The present invention can provide a material that effectively absorbs unnecessary electromagnetic waves in a high frequency region.

BEST MODE FOR CARRYING OUT THE INVENTION

The present invention will be described below in detail.

The present invention is a composition composed of a hexagonal ferrite and a resin.

The hexagonal ferrite is a ferrite in which the crystal lattice takes the form of a hexagonal prism, and has magnetic anisotropy in the c-plane and in the direction of the c-axis, so that it has high resonant frequency.

The hexagonal ferrites are classified into (M-type) $BaM_XFe_{(12-X)}O_{19}$, (Z-type) $Ba_3M_\beta Fe_{24}O_{41}$, (Y-type) $Ba_2M_2Fe_{12}O_{22}$, (W-type) $BaM_2Fe_{16}O_{27}$, (X-type) $Ba_2M_2Fe_{28}O_{46}$, and (U-type) $Ba_4M_2Fe_{36}O_{60}$ by differences in composition and structure. In the formulas, M is one or a combination of two or more selected from the group consisting of Ti, Co, Ni, Zn, Mn, and Cu, and part or all of Ba may be substituted with Sr. Also, in the formula of M-type, X is an integer of 0 to 12, and $\beta$ is 0.1 to 20.

Among the above hexagonal ferrites, the hexagonal ferrites used in the present invention are preferably the M-type, the Y-type, and the Z-type, in terms of electromagnetic wave absorption properties.

The M-type ferrite is also referred to as a magnetoplumbite type ferrite and is represented by the general formula $BaM_XFe_{(12-X)}O_{19}$. In the formula, the M component is one or a combination of two or more selected from a group of atoms consisting of Ti, Co, Ni, Zn, Mn, and Cu. Part or all of Ba may be substituted with Sr.

When the number of moles of the M component to the number of moles of Fe atoms in the M-type ferrite is increased, the resonant frequency decreases. The preferred number of moles of the M component to the number of moles of Fe atoms in the present invention is in the range of $1 \leq \alpha \leq 6.4$, when represented by Fe component:M component=10:$\alpha$. Such a range is preferred because when $\alpha$ is 1 or more, the electromagnetic wave absorption amount is high, and when $\alpha$ is 6.4 or less, the resonant frequency at which the electromagnetic wave absorption effect is maximum is high.

In the above formula of the M-type ferrite, the metal element M preferably comprises at least Co, in terms of the electromagnetic wave absorption amount, more preferably a combination of Ti and Co, and particularly preferably a combination of Ti, Co, and Zn.

The preferred composition ranges of components, when the structure of the M-type ferrite is represented by $Ba(Ti_ACo_BZn_C)_2Fe_{10}O_{19}$, are $0.3 \leq A \leq 1.5$, $0.1 \leq B \leq 1.0$, and $0.1 \leq C \leq 0.7$. The lower limit value or more of each composition range is preferred because a sufficient electromagnetic wave absorption amount is obtained, and the upper limit value or less is preferred because the resonant frequency is high.

The Y-type ferrite is classified into a ferrox planar type and is represented by the general formula $Ba_2M_2Fe_{12}O_{22}$. Part or all of Ba may be substituted with Sr, and M is preferably one or a combination of two or more selected from a group of atoms consisting of Ti, Co, Ni, Zn, Mn, and Cu. Among them, M particularly preferably comprises Zn because the resonant frequency is high, and the electromagnetic wave absorption amount is also large.

When the structural formula wherein M is Zn is represented by $Ba_2(Zn_F)_2Fe_{12}O_{22}$, the composition range of Zn preferably satisfies a condition of $0.35 \leq F \leq 1.35$. Such a condition is preferred because when F is 0.35 or more, a sufficient electromagnetic wave absorption amount is obtained, and when F is 1.35 or less, the resonant frequency is high.

The Z-type ferrite is also classified into the ferrox planar type and is represented by the general formula $Ba_3M_\beta Fe_{24}O_{41}$. Part or all of Ba may be substituted with Sr, and M is preferably one or a combination of two or more selected from a group of atoms consisting of Ti, Co, Ni, Zn, Mn, and Cu. Among them, M preferably comprises at least Co, and further, M particularly preferably comprises Co and Zn because the resonant frequency is high, and the electromagnetic wave absorption amount is also large.

Preferably, when the molar ratio of the Fe component to the M component in the Z-type ferrite is represented by Fe component:M component=24:$\beta$, a condition of $0.5 \leq \beta \leq 2.6$ is satisfied. $\beta$ being 0.5 or more is preferred because a sufficient electromagnetic wave absorption amount is obtained. $\beta$ being 2.6 or less is preferred because the frequency of electromagnetic waves that can be absorbed is high.

When the structure formula wherein M is Co is represented by $Ba_3Co_DZn_EFe_{24}O_{41}$, the preferred composition ranges of components are $0.4 \leq D \leq 2.0$ and $0.1 \leq E \leq 1.0$. The lower limit value or more of each composition range is preferred because a sufficient electromagnetic wave absorption amount is obtained, and the upper limit value or less is preferred because the resonant frequency is high.

The hexagonal ferrite is preferably a powder. The particle diameter of the powder is preferably 1 to 50 μm, and more preferably in a range of 1 to 10 μm. When the particle diameter is 1 μm or more, the handling properties are good. When the particle diameter is 50 μm or less, the dispersibility in the resin is excellent.

When hexagonal ferrite powders having large and small particle diameters are mixed and used, the space between the particles, when the powders are mixed with the resin, can be reduced, so that the filling rate of the powders with respect to the resin can be increased, and as a result, the electromagnetic wave absorption amount of the composition can be improved.

The specific surface area of the hexagonal ferrite powder particles is preferably 0.3 to 2 m²/g. When the specific surface area of the hexagonal ferrite powder particles is 0.3 m²/g or more, the flexibility is excellent when they are mixed with the resin and formed into a sheet. When the specific surface area of the hexagonal ferrite powder particles is 2 m²/g or less, they can be compounded at high concentration with respect to the resin, so that the electromagnetic wave absorption properties of the sheet can be enhanced.

The form of the hexagonal ferrite powder particles includes a spherical shape and a plate shape. The plate shape is preferred because at the stage where the hexagonal ferrite is mixed with the resin and formed into a sheet, the hexagonal ferrite is easily oriented horizontally to the sheet plane, and by the horizontal orientation, there are advantages that the electromagnetic wave absorption amount of the resin composition sheet can be improved, and that the sheet thickness can be reduced.

When the powder particles of the hexagonal ferrite are plate-shaped, the thickness of the plate is preferably 0.05 μm to 5 μm, and more preferably 0.1 μm to 1 μm. Such thickness is good because when the thickness is 0.05 μm or more, there is an advantage that the shape can be maintained during kneading the hexagonal ferrite with the resin, and when the thickness is 5 μm or less, the sheet of the resin composition can be thinned.

For the purpose of improving adhesion of the hexagonal ferrite to the resin, it is also possible to subject the surface of the particles of the hexagonal ferrite to coupling treatment.

Examples of the coupling agent include one or a combination of two or more of titanium type coupling agents, such as isopropyltriisostearoyl titanate, isopropyltri(N-aminoethylaminoethyl)titanate, isopropyltris(dioctylpyrophosphate)titanate, tetraisopropylbis(dioctylphosphite)titanate, tetraisopropyl titanate, tetrabutyl titanate, tetraoctylbis(ditridecylphosphite)titanate, isopropyltrioctanoyl titanate, isopropyltridodecylbenzenesulfonyl titanate, isopropyltri(dioctylphosphate)titanate, bis(dioctylpyrophosphate)ethylene titanate, isopropyldimethacrylisostearoyl titanate, tetra(2,2-diallyloxymethyl-1-butyl)bis(ditridecylphosphite)titanate, isopropyltricumylphenyl titanate, bis(dioctylpyrophosphate)oxyacetate titanate, and isopropylisostearoyldiacryl titanate, coupling agents containing silicone, such as γ-aminopropyltriethoxysilane, N-β-(aminoethyl)-γ-aminopropyltrimethoxysilane, γ-glycidoxy-propyltrimethoxysilane, β-(3,4-epoxycyclohexyl)ethyltrimethoxysilane, vinyltriethoxysilane, vinyl-tris(2-methoxyethoxy)silane, γ-mercaptopropyltrimethoxysilane, N-β-(aminoethyl)-γ-aminopropylmethyldimethoxysilane, γ-methacryloxypropyltrimethoxysilane, N-(3-triethoxysilylpropyl)urea, methyltrimethoxysilane, octadecyltriethoxysilane, vinyltriacetoxysilane, γ-chloropropyltrimethoxysilane, hexamethyldisilazane, γ-anilinopropyltrimethoxysilane, octadecyldimethyl[3-(trimethoxysilyl)propyl]ammonium chloride, γ-chloropropylmethyldimethoxysilane, methyltrichlorosilane, polyalkylene oxide silanes, and perfluoroalkyltrimethoxysilanes, and coupling agents, such as an aluminum type such as acetoalkoxyaluminum diisopropylate, a zirconium type, a chromium type, an iron type, and a tin type.

In order to improve the adhesion of the hexagonal ferrite and a fluororesin, a coupling agent and a surface treatment agent having a F atom in the molecule are preferably used.

The pH of the hexagonal ferrite is preferably 7 to 9, and more preferably 7 to 8.5. When the pH is in the range of 7 to 9, the adhesion to the resin is good, and the flexibility of the sheet of the resin composition is excellent also when the composition of the hexagonal ferrite is increased.

It is also possible to compound ferrite-plated particles, in which the surface of a metal powder is plated with the hexagonal ferrite, with the resin.

The composition of the hexagonal ferrite with respect to the resin composition should be 50 to 98 parts by weight, based on 100 parts by weight of the total amount of the resin composition, and is preferably 75 to 95 parts by weight, and more preferably 90 to 95 parts by weight. When the composition of the hexagonal ferrite is 50 parts by weight or more, effective electromagnetic wave absorption performance is obtained. When the composition of the hexagonal ferrite is 98 parts by weight or less, the composite properties with the resin is excellent.

The resin mixed with the hexagonal ferrite may be either a thermoplastic resin or a thermosetting resin. For the thermoplastic resin, a polymer and copolymer of a monomer having an unsaturated group, such as a double bond or a triple bond, can be used.

The monomer of the polymer and copolymer can include ethylene, propylene, butadiene, isoprene, styrene, α-methylstyrene, methacrylic acid, acrylic acid, methacrylate, acrylate, vinyl chloride, vinylidene chloride, fluorinated ethylene, acrylonitrile, maleic anhydride, and vinyl acetate. Among them, fluorinated ethylene is preferred. Fluorinated ethylene can be represented by the following general formula (B).

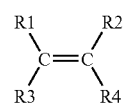

(B)

(R1 to R4 are optionally selected from among H, F, Cl, a hydrocarbon group, an alkoxy group, and a hydrocarbon group or alkoxy group in which part or all of H atoms are substituted with F atoms.)

Examples of thermoplastic resins other than these can include polyphenylene ether, polyamide, polyimide, polyamideimide, polycarbonate, polyester, polyacetal, polyphenylene sulfide, polyethylene glycol, polyetherimide, polyketone, polyetheretherketone, polyethersulfone, and polyarylate.

Examples of the thermosetting resin can include phenolic resins, epoxy resins, cyanate ester, polyimide, polyurethane, bismaleimide resins, alkyd resins, unsaturated polyester, silicone resins, and benzocyclobuten. The above thermoplastic resins and thermosetting resins may be those modified with a compound having a functional group.

The functional group may include one or two or more selected from a vinyl group, an allyl group, a carboxyl group, an acid anhydride group, an ester group, a hydroxyl group, an amino group, an amide group, an imide group, an epoxy group, and halogen.

For the above thermoplastic resins and thermosetting resins, those having a F atom, a Cl atom, and a Br atom in the molecular chain have excellent flame retardancy and can be preferably used. Among them, resins having a fluorine atom are particularly preferred because they have excellent flame retardancy, chemical resistance, low water absorbability, and dielectric properties.

In the resins having a fluorine atom, the weight ratio of the fluorine atoms in the molecular structure of the polymer to the total amount of the polymer is preferably 10 to 70% by weight. When the weight ratio is 10% by weight or more, the flame retardancy, chemical resistance, low water absorbability, and dielectric properties are excellent. When the weight ratio is 70% by weight or less, kneading with the hexagonal ferrite is easy. Among the resins having a fluorine atom, a group called a fluororesin, having a structure represented by the following general formula (A) in the molecular chain, is preferred.

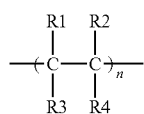

(A)

(R1 to R4 are optionally selected from among H, F, Cl, a hydrocarbon group, an alkoxy group, and a hydrocarbon group or alkoxy group in which part or all of H atoms are substituted with F atoms, but have at least one F atom. n is an integer of 5 or more.)

Examples of the fluororesin include tetrafluoroethylene, perfluoroalkoxyalkane, a perfluoroethylene-propene copolymer, an ethylene-tetrafluoroethylene copolymer, polyvinylidene fluoride, polychlorotrifluoroethylene, an ethylene-chlorofluoroethylene copolymer, a tetrafluoroethylene-perfluorodioxole copolymer, polyvinylidene fluoride, and a propylene-tetrafluoroethylene copolymer. Among them, a tetrafluoroethylene-propylene copolymer and a tetrafluoroethylene-ethylene copolymer are preferably used, and a tetrafluoroethylene-propylene copolymer is most preferred.

The tetrafluoroethylene-propylene copolymer is a copolymer of a tetrafluoroethylene monomer and a propylene monomer, and various properties of the resin vary depending on the composition ratio of both monomers.

The preferred proportion of the number of propylene units to the total number of monomer units in the tetrafluoroethylene-propylene copolymer is 30 to 50%. When the proportion is 30% or more, the hexagonal ferrite can be compounded at high concentration with respect to the resin component. When the proportion is 50% or less, the flame retardancy, chemical resistance, low water absorbability, and dielectric properties of the composition are excellent.

The Mooney viscosity of the tetrafluoroethylene-propylene copolymer is preferably 20 to 50 ML (1+10) 100° C. When the Mooney viscosity is 20 ML (1+10) 100° C. or more, the strength of the sheet of the composition of the tetrafluoroethylene-propylene copolymer and the hexagonal ferrite is excellent. When the Mooney viscosity is 50 ML (1+10) 100° C. or less, the sheet of the composition has sufficient flexibility even if a high composition of the hexagonal ferrite is compounded.

Here, the Mooney viscosity is measured according to JIS K6300. For the notation of a measured value, for example, in the case of 50 ML (1+10) 100° C., 50 M represents a Mooney viscosity, L represents an L-shape, a shape of the rotor, (1+10) represents a preheating time (minute) of 1 minute and a rotor rotation time (minute) of 10 minutes, and 100° C. represents a test temperature of 100° C.

In addition to the resin and the hexagonal ferrite, one or a mixture comprising a combination of two or more selected from the group consisting of a soft magnetic ferrite, a soft magnetic alloy, and a highly thermally conductive inorganic substance, and an electrically conductive substance can be added as a third component to the composition of the present invention.

For the preferred composition of the above components, the resin is 2 to 47 parts by weight, the hexagonal ferrite is 50 to 95 parts by weight, and the third component is 3 to 48 parts by weight, based on 100 parts by weight of the total amount of the resin composition. When the third component is 3 parts by weight or more, the properties of the third component are exhibited. When the third component is 48 parts by weight or less, the electromagnetic wave absorption properties of the hexagonal ferrite in the high frequency region are maintained.

Specific examples of the above soft magnetic ferrite include $MnFe_2O_4$, $CoFe_2O_4$, $NiFe_2O_4$, $CuFe_2O_4$, $ZnFe_2O_4$, $MgFe_2O_4$, $Fe_3O_4$, a Cu—Zn ferrite, a Ni—Zn ferrite, and a Mn—Zn-ferrite.

Specific examples of the above soft magnetic alloy include Fe—Ni, Fe—Co, Fe—Cr, Fe—Si, Fe—Al, Fe—Cr—Si, Fe—Cr—Al, Fe—Al—Si, and Fe—Pt. By adding the above magnetic material different from the hexagonal ferrite to the resin composition, the region of the frequency of electromagnetic waves absorbed by the composition can be widened.

As the above highly thermally conductive inorganic substance, those having a thermal conductivity of 20 W/m·K or more are particularly preferred. Their specific examples can include silica, beryllia, titanium oxide, zirconia, colcothar, zinc oxide, aluminum oxide, aluminum hydroxide, magnesium hydroxide, graphite, metal nitrides, such as boron nitride, aluminum nitride, and iron nitride, and metals, such as copper and aluminum. By adding the above highly thermally conductive inorganic substance, a composition having both of the functions of electromagnetic wave absorption and thermal conductivity is obtained.

As the above electrically conductive substance, metals, such as iron, copper, and aluminum, are preferred, but semiconductors, such as Si, Ge, ZnO, and SiC, can be used.

For the purpose of providing flame retardancy, a flame retardant, such as organic halide, metal hydroxide, and a phosphorus compound, can also be added to the composition of the present invention.

Specific examples of the flame retardant can include hexabromobenzene, decabromobenzylphenyl ether, decabromobenzylphenyl oxide, tetrabromobisphenol, tetrabromophthalic anhydride, tetrabromobisphenol A, tricresyl phosphate, triphenyl phosphate, triallyl phosphate, trichloroethyl phosphate, halogen-containing condensed phosphate, phosphazene, paraffin chloride, perchloropentacyclodecane, aluminum hydroxide, magnesium hydroxide, antimony trioxide, antimony pentoxide, zinc borate, ammonium bromide, and titanium phosphate.

For the manufacture of the composition of the present invention, kneaders, such as a pressure kneader, a Banbury mixer, a twin screw extruder, a single screw extruder, and a roll mixer, can be used.

When the composition is molded, for example, molded into a film or a sheet, injection molding, transfer molding, press molding, T-die extrusion molding, calender molding, and rolling methods and the like, can be used. The molding can also be performed in a magnetic field and an electric field, and with ultrasonic wave, electromagnetic wave, and ultraviolet irradiation, as required.

In the composition of the present invention, the resin component can also be crosslinked for the purpose of improving mechanical properties and solvent resistance.

The composition of the present invention can also be in the form of a coating film by mixing the composition with a solvent to uniformly disperse the composition, then applying the mixture to a support, and drying it.

By impregnating a fiber sheet, such as cloth, paper, and glass cloth, with a varnish obtained by mixing the composition of the present invention with a solvent to uniformly disperse the composition, and then volatilizing the solvent, a composite of these fiber sheet and composition can be obtained.

The composition of the present invention can also be used as a paint. In the case, preferably, the composition and a solvent, such as toluene, xylene, methyl ethyl ketone, acetone, methanol, propanol, cyclohexane, and hexane, are mixed into a solution, emulsion, suspension, slurry, or paste state, or the composition is dispersed in a curable liquid silicone resin or epoxy resin or the like for use.

The presence of the paint of the above composition can provide the electromagnetic wave absorption function. Specific examples include a case where the composition is applied to a resin-molded film and sheet and the like, and a case where the composition is applied to a metal structure to prevent electromagnetic wave reflection.

The composition of the present invention can effectively absorb electromagnetic waves in a high frequency region. The high frequency region in the present invention refers to a region of 1 GHz or more, and particularly, remarkable effect is obtained at 5 GHz or more.

By affixing a sheet of the composition of the present invention to an object, the electromagnetic wave absorption function can be provided to the object. With 0.05 mm or more, the control of the thickness of the sheet is easy, and the electromagnetic wave absorption amount is also sufficient. With 3 mm or less, application to electronic equipment and the like is easy.

The sheet of the composition of the present invention preferably has an adhesive layer. When the sheet has an adhesive layer, it is useful when it is affixed to the desired place. Methods for providing an adhesive layer to the sheet include a method for affixing a double-sided tape to a surface of the sheet, and a method for applying an adhesive material to a surface of the sheet.

The sheet of the composition of the present invention is affixed to members, such as wiring boards, CPUs, LSIs, and wiring, mounted inside electronic equipment and information communication equipment, such as cellular phones, personal computers, and digital cameras, and is used for the absorption of unnecessary electromagnetic noise, which is a cause of the malfunction of the equipment.

The sheet of the composition of the present invention is used for an application for preventing the reflection of radio waves transmitted from automobile-mounted equipment, by being affixed to or painted as a paint on the structure of an electronic toll collection system installed on a road.

The sheet of the composition of the present invention is used for preventing communication failure in vehicle-mounted equipment and its peripheral members used for a traffic information system for communicating traffic information, such as traffic jam, location information, and forward obstacle information to moving automobiles.

The sheet of the composition of the present invention is used for structures, such as buildings, bridges, and steel towers, for preventing the reflection of radar waves.

The sheet of the composition of the present invention is used for ceilings and walls in the rooms of buildings for the purpose of preventing leakage in indoor wireless communication.

EXAMPLES

The evaluation of composition sheets was performed by methods shown in the following (1) to (5).
(1) Radio Wave Absorption Properties
<Evaluation Method 1>
Measurement was performed according to a transmission attenuation power ratio method. On a micro-split line (MSL) having a line width of 2.2 mm and a characteristic impedance of 50 Ω, a sheet having a width of 100 mm and a length of 50 mm or more, which were the size of an MSL substrate, was placed over the entire substrate. The values of S parameters, S11 and S21, were obtained using a network analyzer, and the electromagnetic wave attenuation amount (R) of the sheet was obtained by the following formula.

$$(R)=10 \log [10^{S21/10}/(1-10^{S11/10})] \text{ [dB]}$$

This (R) value was written in a table.
<Evaluation Method 2>
A doughnut-shaped test piece having an outer diameter of 7 mm and an inner diameter of 3 mm was punched from a sheet and inserted into a coaxial tube without clearance. With an end of this coaxial tube short-circuited, the S11 (sample) parameter was measured using a network analyzer. Also, with the coaxial tube in an empty state without sample insertion, the S11 (base) was measured. The electromagnetic wave absorption amount was calculated from the following formula.

$$[\text{electromagnetic wave absorption amount}] = [S11 \text{ (sample)}] - [S11 \text{ (base)}] \text{(dB)}$$

The value of frequency at which this electromagnetic wave absorption amount was maximum, and the absorption amount at the time were written in a table.
(2) Flexibility Test
A 10 cm square composition sheet was bent as shown in FIG. 1 by hands. After 10 seconds, the hands were moved away from the composition sheet, and the composition sheet was left. Then, the state of the sheet was observed. When the sheet was restored to the original state before bending, without a fold and the like, the sheet passed (○). When the sheet was not restored to the original state, the sheet failed (X)
(3) Solvent Resistance Test
A 1 cm square composition sheet was immersed in toluene or chloroform at room temperature for 24 hours. When the magnetic powder separated from the composition into the solvent, the composition sheet was X (not good). When the magnetic powder did not separate, the composition sheet was ○ (good)
(4) Hot Water Resistance Test (PCT Test)
1 cm square composition sheet was placed in a saturated water vapor at 1.2 atmospheric pressure for 2 hours. Then, the sheet was bent. As a result, when the sheet was restored to the original sheet state, the sheet passed (○). When the sheet was damaged, for example, tore or collapsed, the sheet failed (X)
(5) Burning Test
Part of a composition sheet was cut out, brought into direct contact with the flame of a gas burner for 10 seconds, and moved away from the flame. Then, when the sheet continued to be burned for 5 seconds or more, the sheet was X (not good). When the sheet did not continue to be burn for 5 seconds or more (the flame went out immediately), the sheet was ○ (good).
(6) Thermal Conductivity Test
A quick thermal conductivity meter, KEMTHRM QTM-D3 type (manufactured by Kyoto Electronics Manufacturing Co., Ltd.), was used. A sheet sample to be measured was placed on a standard sample having known thermal conductivity, and the thermal conductivity (Q1) of the whole of the standard sample and the sheet combined was measured. When the thermal conductivity of the standard sample was (Q2), the deviation (∈) was obtained from the following formula.

$$(\in) = [(Q1) - (Q2)] / (Q2)$$

(∈) was plotted with respect to log(Q2), the thermal conductivity at (∈) of zero was obtained by interpolation, and the thermal conductivity of the sheet sample was obtained.

For the standard sample, silicon rubber (Q2)=0.241 (W/m·K), a rubber plate (Q2)=0.536 (W/m·K), quartz glass (Q2)=1.416 (W/m·K), and zirconia (Q2)=3.277 (W/m·K) were used.

Resins used in examples are shown in Table 1 and Table 2, and hexagonal ferrites are shown in Table 3, Table 4, and Table 5.

TABLE 1

Ethylene tetrafluoride-propylene copolymer

| No. | Proportion of the number of propylene units [%] | Proportion of fluorine atoms in resin [wt %] | Mooney viscosity [ML(1 + 10)100° C.] |
|---|---|---|---|
| A-1 | 38 | 59 | 42 |
| A-2 | 21 | 67 | 40 |
| A-3 | 58 | 46 | 40 |
| A-4 | 38 | 59 | 23 |
| A-5 | 38 | 59 | 49 |
| A-6 | 38 | 59 | 60 |

TABLE 2

Other resins

| | |
|---|---|
| A-7 | chlorinated polyethylene |
| A-8 | acrylonitrile butadiene rubber |
| A-9 | ethylene tetrafluoride-ethylene copolymer |
| A-10 | perfluoroethylene polymer |
| A-11 | polyethylene |

TABLE 3

M-type hexagonal ferrite

| No. | Structural formula | α |
|---|---|---|
| M-1 | $Ba(Ti_{0.6}Co_{1.3}Zn_{0.3})_2Fe_{10}O_{19}$ | 4.2 |
| M-2 | $Ba(Ti_{1.5}Co_{1.0}Zn_{0.4})_2Fe_{10}O_{19}$ | 5.8 |
| M-3 | $Ba(Ti_{0.4}Co_{0.2}Zn_{0.1})_2Fe_{10}O_{19}$ | 1.4 |
| M-4 | $Ba(Ti_{0.2}Co_{0.09}Zn_{0.11})_2Fe_{10}O_{19}$ | 0.8 |
| M-5 | $Ba(Ti_{1.7}CoZn_{0.8})_2Fe_{10}O_{19}$ | 7 |
| M-6 | $Ba(Ti_{0.6}Co_{0.6})_2Fe_{10}O_{19}$ | 2.4 |
| M-7 | $Ba(Ti_{0.5}Co_{0.5})_2Fe_{10}O_{19}$ | 2 |
| M-8 | $Ba(Ti\text{—}Mn)_2Fe_{10}O_{19}$ | 2.0 |
| M-9 | $Ba(Ti\text{—}Cu)_2Fe_{10}O_{19}$ | 2.0 |
| M-10 | $Sr(Ti_{0.6}Co_{1.3}Zn_{0.3})_2Fe_{10}O_{19}$ | 4.2 |

TABLE 4

Y-type hexagonal ferrite

| No. | Structural formula | F |
|---|---|---|
| Y-1 | $Ba_2(Zn_{0.7})_2Fe_{12}O_{22}$ | 0.7 |
| Y-2 | $Ba_2(Zn_{0.4})_2Fe_{12}O_{22}$ | 0.4 |
| Y-3 | $Ba_2(Zn_{1.3})_2Fe_{12}O_{22}$ | 1.3 |
| Y-4 | $Ba_2(Zn_{0.1})_2Fe_{12}O_{22}$ | 0.1 |
| Y-5 | $Ba_2(Zn_{1.5})_2Fe_{12}O_{22}$ | 1.5 |

TABLE 5

Z-type hexagonal ferrite

| No. | Structural formula | β |
|---|---|---|
| Z-1 | $Ba_2Co_{1.1}Zn_{0.5}Fe_{24}O_{41}$ | 1.6 |
| Z-2 | $Ba_2Co_{0.5}Zn_{0.2}Fe_{24}O_{41}$ | 0.7 |
| Z-3 | $Ba_2Co_{0.5}Zn_{0.9}Fe_{24}O_{41}$ | 1.4 |
| Z-4 | $Ba_2Co_{1.9}Zn_{0.2}Fe_{24}O_{41}$ | 2.1 |

Example 1

15 g of an ethylene tetrafluoride-propylene copolymer (A-1) was put into a kneader and kneaded in a nitrogen atmosphere at 130° C. for 3 minutes. Then, 135 g of an M-type hexagonal ferrite, $Ba(Ti_{0.55}Co_{1.33}Zn_{0.33})_2Fe_{10}O_{19}$ (M-1), was added, while kneaded with the resin, over 5 minutes. During the addition, the temperature of the sample continued to rise and finally reached 170° C. Also after a total amount of (M-1) was added, kneading was continued for 10 minutes to obtain a composition of (A-1) and (M-1). For the composition of the components based on 100 parts by weight of the total amount of the composition, (A-1) was 10 parts by weight, and (M-1) was 90 parts by weight. Next, the composition was compression molded under conditions of 200° C. and 10 MPa for 5 minutes using a compression molding machine to obtain a flexible sheet having a thickness of 2 mm. The results of the evaluation of the sheet are shown in Table 6.

Example 2

Operation similar to that of Example 1 was performed except that 22.5 g of (A-1) and 127.5 g of (M-1) were used for the composition of the raw materials of the composition. For the composition of the components based on 100 parts by weight of the total amount of the composition, (A-1) was 15 parts by weight, and (M-1) was 85 parts by weight. The results of the evaluation of the sheet are shown in Table 6.

Example 3

Operation similar to that of Example 1 was performed except that 4 g of (A-1) and 96 g of (M-1) were used for the composition of the raw materials of the composition. For the composition of the components based on 100 parts by weight of the total amount of the composition, (A-1) was 4 parts by weight, and (M-1) was 96 parts by weight. The results of the evaluation of the sheet are shown in Table 6.

Example 4

Operation similar to that of Example 1 was performed except that 30 g of (A-1) and 120 g of (M-1) were used for the composition of the raw materials of a composition to obtain the composition. For the composition of the components based on 100 parts by weight of the total amount of the composition, (A-1) was 20 parts by weight, and (M-1) was 80 parts by weight. The results of the evaluation of the sheet are shown in Table 6.

Example 5

Operation similar to that of Example 1 was performed except that for the composition of the raw materials of the composition, (A-1) was 60 g, and (M-1) was 90 g. For the composition of the components based on 100 parts by weight of the total amount of the composition, (A-1) was 40 parts by weight, and (M-1) was 60 parts by weight. The results of the evaluation of the sheet are shown in Table 6.

Example 6

Operation similar to that of Example 1 was performed except that an M-type hexagonal ferrite (M-2), $Ba(Ti_{1.5}Co_{1.0}Zn_{0.4})_2Fe_{10}O_{19}$, was used instead of (M-1). The results of the evaluation of the sheet are shown in Table 6.

Example 7

Operation similar to that of Example 1 was performed except that an M-type hexagonal ferrite (M-3), $Ba(Ti_{0.40}Co_{0.2}Zn_{0.1})_2Fe_{10}O_{19}$, was used instead of (M-1). The results of the evaluation of the sheet are shown in Table 6.

Example 8

Operation similar to that of Example 1 was performed except that an M-type hexagonal ferrite (M-4), $Ba(Ti_{0.20}Co_{0.09}Zn_{0.11})_2Fe_{10}O_{19}$, was used instead of (M-1). The results of the evaluation of the sheet are shown in Table 6.

Example 9

Operation similar to that of Example 1 was performed except that an M-type hexagonal ferrite (M-5), $Ba(Ti_{1.7}Co_{0.8})_2Fe_{10}O_{19}$, was used instead of (M-1). The results of the evaluation of the sheet are shown in Table 7.

Example 10

Operation similar to that of Example 1 was performed except that an M-type hexagonal ferrite (M-6), $Ba(Ti_{0.6}Co_{0.6})_2Fe_{10}O_{19}$, was used instead of (M-1). The results of the evaluation of the sheet are shown in Table 7.

Example 11

Operation similar to that of Example 1 was performed except that an M-type hexagonal ferrite (M-7), $Ba(Ti_{0.5}Co_{0.5})_2Fe_{10}O_{19}$, was used instead of (M-1). The results of the evaluation of the sheet are shown in Table 7.

Example 12

Operation similar to that of Example 1 was performed except that an M-type hexagonal ferrite (M-8), $Ba(Ti.Mn)_2Fe_{10}O_{19}$, was used instead of (M-1). The results of the evaluation of the sheet are shown in Table 7.

Example 13

Operation similar to that of Example 1 was performed except that an M-type hexagonal ferrite (M-9), $Ba(Ti.Cu)_2Fe_{10}O_{19}$, was used instead of (M-1). The results of the evaluation of the sheet are shown in Table 7.

Example 14

Operation similar to that of Example 1 was performed except that $Sr(Ti_{0.6}Co_{1.3}Zn_{0.3})_2Fe_{10}O_{19}$, (M-10), was used instead of (M-1). The results of the evaluation of the sheet are shown in Table 7.

Example 15

Operation similar to that of Example 1 was performed except that for formulation composition, (A-1) was 30 g, and a Y-type hexagonal ferrite (Y-1), $Ba_2(Zn_{0.7})_2Fe_{12}O_{22}$, instead of (M-1), was 120 g. For the composition of the components when the total amount was 100 parts by weight, (A-1) was 20 parts by weight, and (Y-1) was 80 parts by weight. The results of the evaluation of the sheet are shown in Table 8.

Example 16

Operation similar to that of Example 15 was performed except that a Y-type hexagonal ferrite (Y-2), $Ba_2(Zn_{0.4})_2Fe_{12}O_{22}$, was used instead of (Y-1). The results of the evaluation of the sheet are shown in Table 8.

Example 17

Operation similar to that of Example 15 was performed except that a Y-type hexagonal ferrite (Y-3), $Ba_2(Zn_{1.3})_2Fe_{12}O_{22}$, was used instead of (Y-1). The results of the evaluation of the sheet are shown in Table 8.

Example 18

Operation similar to that of Example 1 was performed except that a Y-type hexagonal ferrite (Y-4), $Ba_2(Zn_{0.1})_2Fe_{12}O_{22}$, was used instead of (M-1) so as to change the composition to values shown in Table 8. The results of the evaluation of the sheet are shown in Table 8.

Example 19

Operation similar to that of Example 2 was performed except that a Y-type hexagonal ferrite (Y-5), $Ba_2(Zn_{1.5})_2Fe_{12}O_{22}$, was used instead of (M-1) so as to change the composition to values shown in the Table 8.

Example 20

Operation similar to that of Example 1 was performed except that a Z-type hexagonal ferrite (Z-1), $Ba_3Co_{1.1}Zn_{0.5}Fe_{24}O_{41}$, was used instead of (M-1). The results of the evaluation of the sheet are shown in Table 9.

Example 21

Operation similar to that of Example 2 was performed except that a Z-type hexagonal ferrite (Z-1), $Ba_3Co_{1.1}Zn_{0.5}Fe_{24}O_{41}$, was used instead of (M-1). The results of the evaluation of the sheet are shown in Table 9.

Example 22

Operation similar to that of Example 1 was performed except that a Z-type hexagonal ferrite (Z-2), $Ba_3Co_{0.5}Zn_{0.2}Fe_{24}O_{41}$, was used instead of (Z-1). The results of the evaluation of the sheet are shown in Table 9.

Example 23

Operation similar to that of Example 1 was performed except that a Z-type hexagonal ferrite (Z-3), $Ba_3Co_{0.5}Zn_{0.9}Fe_{24}O_{41}$, was used instead of (Z-1). The results of the evaluation of the sheet are shown in Table 9.

Example 24

Operation similar to that of Example 1 was performed except that a Z-type hexagonal ferrite (Z-4), $Ba_2Co_{1.9}Zn_{0.2}Fe_{24}O_{41}$, was used instead of (Z-1). The results of the evaluation of the sheet are shown in Table 9.

Example 25

Operation similar to that of Example 2 was performed except that (A-2) was used instead of (A-1). The results of the evaluation of the sheet are shown in Table 10.

Example 26

Operation similar to that of Example 1 was performed except that (A-3) was used instead of (A-1). The results of the evaluation of the sheet are shown in Table 10.

Example 27

Operation similar to that of Example 2 was performed except that (A-4) was used instead of (A-1). The results of the evaluation of the sheet are shown in Table 10.

Example 28

Operation similar to that of Example 1 was performed except that (A-3) was used instead of (A-1), and that (Y-1) was used instead of (M-1). The results of the evaluation of the sheet are shown in Table 10.

Example 29

Operation similar to that of Example 1 was performed except that (A-3) was used instead of (A-1), and that (Z-1) was used instead of (M-1). The results of the evaluation of the sheet are shown in Table 10.

Example 30

Operation similar to that of Example 3 was performed except that (A-4) was used instead of (A-1). The results of the evaluation of the sheet are shown in Table 10.

Example 31

Operation similar to that of Example 1 was performed except that (A-5) was used instead of (A-1). The results of the evaluation of the sheet are shown in Table 10.

Example 32

Operation similar to that of Example 2 was performed except that (A-6) was used instead of (A-1). The results of the evaluation of the sheet are shown in Table 10.

Example 33

Chlorinated polyethylene (A-7) was used instead of (A-1). Operation similar to that of Example 1 was performed except that the initial temperature during kneading was 100° C., that the finally reaching temperature was 150° C., and the temperature during the compression molding of the composition obtained by kneading was 180° C. The results of the evaluation of the sheet are shown in Table 11.

Example 34

Operation similar to that of Example 1 was performed except that acrylonitrile butadiene rubber (A-8) was used instead of (A-1). The results of the evaluation of the sheet are shown in Table 11.

Example 35

Operation similar to that of Example 1 was performed except that ethylene tetrafluoride-ethylene copolymer (A-9) was used instead of (A-1). The results of the evaluation of the sheet are shown in Table 11.

Example 36

Operation similar to that of Example 1 was performed except that perfluoroethylene polymer (A-10) was used instead of (A-1). The results of the evaluation of the sheet are shown in Table 11.

Example 37

15 g of (A-11), 120 g of (M-1), and 15 g of magnesium hydroxide were kneaded at a resin temperature of 120° C., and the kneaded material was compression pressed at 150° C. at 5 MPa for 3 minutes to obtain a sheet. The results of the evaluation of the sheet are shown in Table 12.

Example 38

Operation similar to that of Example 37 was performed except that 20 g of (A-11) and 120 g of (M-1) were used. The results of the evaluation of the sheet are shown in Table 12.

Example 39

Operation similar to that of Example 1 was performed except that for formulation composition, (A-1) was 20 g, (M-1) was 120 g, and graphite was 10 g. For the composition of the components based on 100 parts by weight of the total amount of the resin composition, (A-1) was 13 parts by weight, (M-1) was 80 parts by weight, and graphite was 7 parts by weight. The result of the measurement of thermal conductivity was 1.5 W/m·k, and the effect of improvement was seen, compared with the thermal conductivity of the sheet obtained in Example 1, 0.8 W/m·K. The results of the evaluation of the sheet are shown in Table 12.

Example 40

Operation similar to that of Example 1 was performed except that for formulation composition, (A-1) was 20 g, (M-1) was 120 g, and alumina was 10 g. For the composition of the components based on 100 parts by weight of the total amount of the resin composition, (A-1) was 13 parts by weight, (M-1) was 80 parts by weight, and alumina was 7 parts by weight. The result of the measurement of thermal conductivity was 1.4 W/m·k, and the effect of improvement was seen, compared with the thermal conductivity of the sheet obtained in Example 1, 0.8 W/m·K. The results of the evaluation of the sheet are shown in Table 12.

Example 41

Operation similar to that of Example 1 was performed except that for formulation composition, (A-1) was 30 g, (M-1) was 90 g, and a flat sendust powder was 30 g. For the composition of the components based on 100 parts by weight of the total amount of the resin composition, (A-1) was 20 parts by weight, (M-1) was 60 parts by weight, and sendust was 20 parts by weight. In the method of <Evaluation Method 2> for radio wave absorption properties, the peak due to the sendust powder was seen at 0.8 GHz, and the peak due to M-1 was seen at 10.1 GHz. The results of the evaluation of the sheet are shown in Table 12.

Comparative Example 1

Operation similar to that of Example 1 was performed except that a Ni—Zn ferrite which is a cubic ferrite was used instead of (M-1). The results of the evaluation of the sheet are shown in Table 13.

Comparative Example 2

2 g of (A-1) and 148 g of the M-type hexagonal ferrite (M-2) were fed to a kneader to try kneading at 150° C., but uniform mixing was impossible. For the composition of the components, (A-1) was 1.3 parts by weight, and (M-2) was 98.7 parts by weight, based on 100 parts by weight of the total amount of the composition.

Comparative Example 3

Operation similar to that of Comparative Example 2 was performed except that (Y-2) was used instead of (M-2). Also in this case, uniform mixing was impossible.

Comparative Example 4

Operation similar to that of Comparative Example 2 was performed except that (Z-2) was used instead of (M-2). Also in this case, uniform mixing was impossible.

Comparative Example 5

Operation similar to that of Example 1 was performed except that for formulation composition, (M-1) was 90 g, and (A-1) was 60 g. For the composition of the components, (A-1) was 60 parts by weight, and (M-1) was 40 parts by weight, based on 100 parts by weight of the total amount of the composition. The results of evaluation are shown in Table 13.

Comparative Example 6

Operation similar to that of Comparative Example 5 was performed except that (Y-1) was used instead of (M-1). The results of evaluation are shown in Table 13.

Comparative Example 7

Operation similar to that of Comparative Example 5 was performed except that (Z-1) was used instead of (M-1). The results of evaluation are shown in Table 13.

TABLE 6

| | | Example 1 | Example 2 | Example 3 | Example 4 | Example 5 | Example 6 | Example 7 | Example 8 |
|---|---|---|---|---|---|---|---|---|---|
| resin | No. | A-1 | A-1 | A-1 | A-1 | A-1 | A-1 | A-1 | A-1 |
| | composition based on 100 parts by weight of total amount of composition [parts by weight] | 10 | 15 | 4 | 20 | 40 | 10 | 10 | 10 |
| hexagonal ferrite | No. | M-1 | M-1 | M-1 | M-1 | M-1 | M-2 | M-3 | M-4 |
| | composition based on 100 parts by weight of total amount of composition [parts by weight] | 90 | 85 | 96 | 80 | 60 | 90 | 90 | 90 |
| sheet properties | flexibility | ○ | ○ | X | ○ | ○ | ○ | ○ | ○ |
| | solvent resistance test — chloroform | ○ | ○ | ○ | ○ | ○ | ○ | ○ | ○ |
| | toluene | ○ | ○ | ○ | ○ | ○ | ○ | ○ | ○ |
| | 10% ammonia water | ○ | ○ | ○ | ○ | ○ | ○ | ○ | ○ |
| | hot water resistance test | ○ | ○ | ○ | ○ | ○ | ○ | ○ | ○ |
| | burning property test | ○ | ○ | ○ | ○ | ○ | ○ | ○ | ○ |
| electromagnetic wave absorption properties | Evaluation Method 1 | | | | | | | | |
| | (R) 5 GHz [dB] | 9.6 | 8.5 | 11 | 7.7 | 4.7 | 9.6 | 6.8 | 5.2 |
| | (R) 10 GHz [dB] | 38 | 34 | 43 | 30 | 18 | 16 | 21 | 15 |
| | Evaluation Method 2 | | | | | | | | |
| | peak frequency [GHz] | 11.2 | 11.5 | 12.2 | 11.2 | 11.5 | 7.3 | 18.9 | 20.5 |
| | electromagnetic wave absorption amount at peak frequency [dB] | 27 | 24 | 30 | 19 | 13 | 23 | 22 | 14 |

TABLE 7

| | | Example 9 | Example 10 | Example 11 | Example 12 | Example 13 | Example 14 |
|---|---|---|---|---|---|---|---|
| | No. | A-1 | A-1 | A-1 | A-1 | A-1 | A-1 |
| | composition based on 100 parts by weight of total amount of composition [parts by weight] | 10 | 10 | 10 | 10 | 10 | 10 |

TABLE 7-continued

|  |  | Example 9 | Example 10 | Example 11 | Example 12 | Example 13 | Example 14 |
|---|---|---|---|---|---|---|---|
|  | No. | M-5 | M-6 | M-7 | M-8 | M-9 | M-10 |
|  | composition based on 100 parts by weight of total amount of composition [parts by weight] | 90 | 90 | 90 | 90 | 90 | 90 |
|  | flexibility | ○ | ○ | ○ | ○ | ○ | ○ |
| solvent resistance test | chloroform | ○ | ○ | ○ | ○ | ○ | ○ |
|  | toluene | ○ | ○ | ○ | ○ | ○ | ○ |
|  | 10% ammonia water | ○ | ○ | ○ | ○ | ○ | ○ |
| hot water resistance test |  | ○ | ○ | ○ | ○ | ○ | ○ |
| burning property test |  | ○ | ○ | ○ | ○ | ○ | ○ |
| electromagnetic wave absorption properties | Evaluation Method 1 |  |  |  |  |  |  |
|  | (R) 5 GHz[dB] | 6.1 | 6.8 | 6.1 | 6.5 | 6.4 | 6.5 |
|  | (R) 10 GHz[dB] | 12 | 21 | 12 | 23 | 19 | 15 |
|  | Evaluation Method 2 |  |  |  |  |  |  |
|  | peak frequency [GHz] | 1.1 | 21.5 | 1.1 | 23 | 16.2 | 24 |
|  | electromagnetic wave absorption amount at peak frequency [dB] | 31 | 25 | 31 | 38 | 33 | 30 |

TABLE 8

|  |  |  | Example 15 | Example 16 | Example 17 | Example 18 | Example 19 |
|---|---|---|---|---|---|---|---|
| resin | No. |  | A-1 | A-1 | A-1 | A-1 | A-1 |
|  | composition based on 100 parts by weight of total amount of composition [parts by weight] |  | 20 | 20 | 20 | 10 | 15 |
| hexagonal ferrite | No. |  | Y-1 | Y-2 | Y-3 | Y-4 | Y-5 |
|  | composition based on 100 parts by weight of total amount of composition [parts by weight] |  | 80 | 80 | 80 | 90 | 85 |
| sheet properties | flexibility |  | ○ | ○ | ○ | ○ | ○ |
|  | solvent resistance test | chloroform | ○ | ○ | ○ | ○ | ○ |
|  |  | toluene | ○ | ○ | ○ | ○ | ○ |
|  |  | 10% ammonia water | ○ | ○ | ○ | ○ | ○ |
|  | hot water resistance test |  | ○ | ○ | ○ | ○ | ○ |
|  | burning property test |  | ○ | ○ | ○ | ○ | ○ |
|  | electromagnetic wave absorption properties | Evaluation Method 1 |  |  |  |  |  |
|  |  | (R) 5 GHz[dB] | 18 | 15 | 23 | 16 | 10 |
|  |  | (R) 10 GHz[dB] | 29 | 22 | 25 | 25 | 18 |
|  |  | Evaluation Method 2 |  |  |  |  |  |
|  |  | peak frequency [GHz] | 2.9 | 3.8 | 2.2 | 5.2 | 1.1 |
|  |  | electromagnetic wave absorption amount at peak frequency [dB] | 25 | 22 | 21 | 13 | 32 |

TABLE 9

|  | Example 20 | Example 21 | Example 22 | Example 23 | Example 24 |
|---|---|---|---|---|---|
| No. | A-1 | A-1 | A-1 | A-1 | A-1 |
| composition based on 100 parts by weight of total amount of composition [parts by weight] | 10 | 15 | 10 | 10 | 10 |
| No. | Z-1 | Z-1 | Z-2 | Z-3 | Z-4 |
| composition based on 100 parts by weight of total amount of composition [parts by weight] | 90 | 85 | 90 | 90 | 90 |
| flexibility | ○ | ○ | ○ | ○ | ○ |

TABLE 9-continued

|  |  | Example 20 | Example 21 | Example 22 | Example 23 | Example 24 |
|---|---|---|---|---|---|---|
| solvent resistance test | chloroform | ○ | ○ | ○ | ○ | ○ |
|  | toluene | ○ | ○ | ○ | ○ | ○ |
|  | 10% ammonia water | ○ | ○ | ○ | ○ | ○ |
| hot water resistance test |  | ○ | ○ | ○ | ○ | ○ |
| burning property test |  | ○ | ○ | ○ | ○ | ○ |
| electromagnetic wave absorption properties | Evaluation Method 1 |  |  |  |  |  |
|  | (R) 5 GHz[dB] | 16 | 10 | 18 | 17 | 73 |
|  | (R) 10 GHz[dB] | 25 | 18 | 29 | 27 | 32 |
|  | Evaluation Method 2 |  |  |  |  |  |
|  | peak frequency [GHz] | 2.5 | 2.5 | 4.8 | 2.2 | 1.3 |
|  | electromagnetic wave absorption amount at peak frequency [dB] | 26 | 21 | 24 | 24 | 28 |

TABLE 10

|  |  |  | Example 25 | Example 26 | Example 27 | Example 28 | Example 29 | Example 30 | Example 31 | Example 32 |
|---|---|---|---|---|---|---|---|---|---|---|
| resin |  | No. | A-2 | A-3 | A-4 | A-3 | A-3 | A-4 | A-5 | A-6 |
|  |  | composition based on 100 parts by weight of total amount of composition [parts by weight] | 15 | 15 | 15 | 10 | 10 | 4 | 10 | 15 |
| hexagonal ferrite |  | No. | M-1 | M-1 | M-1 | Y-1 | Z-1 | M-1 | M-1 | M-1 |
|  |  | composition based on 100 parts by weight of total amount of composition [parts by weight] | 85 | 90 | 85 | 90 | 90 | 96 | 90 | 85 |
| sheet properties |  | flexibility | X | ○ | ○ | ○ | ○ | ○ | ○ | X |
|  | solvent resistance test | chloroform | ○ | X | X | ○ | ○ | ○ | ○ | ○ |
|  |  | toluene | ○ | ○ | X | ○ | ○ | ○ | ○ | ○ |
|  |  | 10% ammonia water | X | ○ | ○ | ○ | ○ | ○ | ○ | ○ |
|  | hot water resistance test |  | ○ | ○ | X | ○ | ○ | ○ | ○ | ○ |
|  | burning property test |  | ○ | X | X | ○ | ○ | ○ | ○ | ○ |
|  | electromagnetic wave absorption properties | Evaluation Method 1 |  |  |  |  |  |  |  |  |
|  |  | (R) 5 GHz[dB] | 8.5 | 8.6 | 8.7 | 23 | 18 | 10 | 9.3 | 8.6 |
|  |  | (R) 10 GHz[dB] | 29 | 30 | 31 | 25 | 35 | 41 | 32 | 33 |
|  |  | Evaluation Method 2 |  |  |  |  |  |  |  |  |
|  |  | peak frequency [GHz] | 11.6 | 11.5 | 11.7 | 2.2 | 2.6 | 11.7 | 11.5 | 11.6 |
|  |  | electromagnetic wave absorption amount at peak frequency [dB] | 21 | 22 | 21 | 21 | 25 | 34 | 28 | 24 |

TABLE 11

|  |  | Example 33 | Example 34 | Example 35 | Example 36 |
|---|---|---|---|---|---|
|  | No. | A-7 | A-8 | A-9 | A-10 |
|  | composition based on 100 parts by weight of total amount of composition [parts by weight] | 10 | 10 | 10 | 10 |
|  | No. | M-1 | M-1 | M-1 | M-1 |
|  | composition based on 100 parts by weight of total amount of composition [parts by weight] | 90 | 90 | 90 | 90 |
|  | flexibility | ○ | ○ | X | X |
| solvent resistance test | chloroform | X | X | ○ | ○ |
|  | toluene | X | X | ○ | ○ |
|  | 10% ammonia water | ○ | ○ | X | X |

TABLE 11-continued

|  |  | Example 33 | Example 34 | Example 35 | Example 36 |
|---|---|---|---|---|---|
| hot water resistance test | | ○ | X | ○ | ○ |
| burning property test | | ○ | X | ○ | ○ |
| electromagnetic wave absorption properties | Evaluation Method 1 | | | | |
| | (R) 5 GHz[dB] | 15 | 14 | 16 | 14 |
| | (R) 10 GHz[dB] | 25 | 27 | 29 | 27 |
| | Evaluation Method 2 | | | | |
| | peak frequency [GHz] | 11.5 | 11.6 | 11.7 | 11.5 |
| | electromagnetic wave absorption amount at peak frequency [dB] | 20 | 27 | 28 | 28 |

TABLE 12

|  |  | Example 37 | Example 38 | Example 39 | Example 40 | Example 41 |
|---|---|---|---|---|---|---|
| resin | No. | A-11 | A-11 | A-1 | A-1 | A-1 |
| | composition based on 100 parts by weight of total amount of composition [parts by weight] | 10 | 20 | 13 | 13 | 20 |
| hexagonal ferrite | No. | M-1 | M-1 | M-1 | M-1 | M-1 |
| | composition based on 100 parts by weight of total amount of composition [parts by weight] | 80 | 80 | 80 | 80 | 60 |
| additive | name | magnesium hydroxide | | graphite | alumina | flat sendust |
| | composition [% by weight] | 10 | | 7 | 7 | 20 |
| | flexibility | ○ | ○ | ○ | ○ | ○ |
| solvent resistance test | chloroform | X | X | ○ | ○ | ○ |
| | toluene | X | X | ○ | ○ | ○ |
| | 10% ammonia water | ○ | ○ | ○ | ○ | ○ |
| hot water resistance test | | X | X | ○ | ○ | ○ |
| burning property test | | ○ | ○ | ○ | ○ | ○ |
| electromagnetic wave absorption properties | Evaluation Method 1 | | | | | |
| | (R) 5 GHz[dB] | 8.6 | 8.3 | 8.4 | 6.2 | 6.1 |
| | (R) 10 GHz[dB] | 15 | 17 | 16 | 19 | 20 |
| | Evaluation Method 2 | | | | | |
| | peak frequency [GHz] | 12.5 | 12.2 | 12.3 | 11.9 | 0.8   10.1 |
| | electromagnetic wave absorption amount at peak frequency [dB] | 23 | 24 | 25 | 14 | 9   14 |

TABLE 13

|  |  | Comparative Example 1 | Comparative Example 5 | Comparative Example 6 | Comparative Example 7 |
|---|---|---|---|---|---|
| resin | No. | A-1 | A-1 | A-1 | A-1 |
| | composition based on 100 parts by weight of total amount of composition [parts by weight] | 10 | 60 | 60 | 60 |
| ferrite | No. | Ni—Zn ferrite | M-1 | Y-1 | Z-1 |
| | composition based on 100 parts by weight of total amount of composition [parts by weight] | 90 | 40 | 40 | 40 |
| sheet properties | flexibility | ○ | ○ | ○ | ○ |
| solvent resistance test | chloroform | ○ | ○ | ○ | ○ |
| | toluene | ○ | ○ | ○ | ○ |
| | 10% ammonia water | ○ | ○ | ○ | ○ |

TABLE 13-continued

|  |  | Comparative Example 1 | Comparative Example 5 | Comparative Example 6 | Comparative Example 7 |
|---|---|---|---|---|---|
| hot water resistance test | | ○ | ○ | ○ | ○ |
| burning property test | | ○ | ○ | ○ | ○ |
| electromagnetic wave absorption properties | Evaluation Method 1 | | | | |
| | (R) 5 GHz[dB] | 1.3 | 2.8 | less than 0.1 | less than 0.1 |
| | (R) 10 GHz[dB] | 0.8 | 4.5 | less than 0.1 | less than 0.1 |
| | Evaluation Method 2 | | | | |
| | peak frequency [GHz] | 0.6 | no peak | no peak | no peak |
| | electromagnetic wave absorption amount at peak frequency [dB] | 21 | 0 | 0 | 0 |

INDUSTRIAL APPLICABILITY

By affixing a sheet of the composition of the present invention inside electronic equipment, such as personal computers and cellular phones, and general electrical products, it is possible to effectively absorb unnecessary electromagnetic waves in a high frequency region of 1 GHz or more generated in the circuits to prevent the malfunction of the equipment, and to reduce the intensity of the radiation of the unnecessary electromagnetic waves outside the equipment. The composition of the present invention absorbs radar waves transmitted from aircraft, watercraft, and automobiles to prevent the false recognition of a target due to diffuse reflection and false reflection.

BRIEF DESCRIPTION OF THE DRAWING

FIG. 1 is a view showing the method of the flexibility test (bending test) evaluated in the present invention.

The invention claimed is:

1. A resin composition comprising a hexagonal ferrite and a tetrafluoroethylene-propylene copolymer, wherein the resin composition comprises 50 to 98 parts by weight of the hexagonal ferrite, based on 100 parts by weight of a total amount of the resin composition,
a proportion of a number of propylene units to a total number of monomer units in the tetrafluoroethylene-propylene copolymer is 30 to 50%, and
a Mooney viscosity of the tetrafluoroethylene-propylene copolymer is 20 to 50 ML (1+10) 100° C.

2. The resin composition according to claim 1, comprising 75 to 95 parts by weight of the hexagonal ferrite.

3. The resin composition according to claim 1, comprising 2 to 47 parts by weight of the resin, 50 to 95 parts by weight of the hexagonal ferrite, and 3 to 48 parts by weight of one or a mixture comprising a combination of two or more selected from the group consisting of a soft magnetic ferrite, a soft magnetic alloy, a highly thermally conductive inorganic substance, and an electrically conductive substance, based on 100 parts by weight of the total amount of the resin composition.

4. The resin composition according to claim 1, wherein the hexagonal ferrite is one or a mixture of two or more selected from the group consisting of an M-type, a Z-type, and a Y-type having the following general formulas:

(M-type) $BaM_XFe_{(12-X)}O_{19}$ (Z-type) $Ba_3M_\beta Fe_{24}O_{41}$ (Y-type) $Ba_2M_2Fe_{12}O_{22}$ wherein, M is one or a combination of two or more selected from the group consisting of Ti, Co, Ni, Zn, Mn, and Cu, and part or all of Ba may be substituted with Sr, and
wherein in the formula of the M-type, X is an integer of 0 to 12, and in the formula of the Z-type, $\beta$ is 0.1 to 20.

5. The resin composition according to claim 4, wherein when the resin composition comprises the M-type as the hexagonal ferrite, a condition of $1.0 \leq \alpha \leq 6.4$ is satisfied, provided that a molar ratio of a Fe component to an M component in the M-type is represented by Fe component: M component=$10:\alpha$.

6. The resin composition according to claim 4, wherein when the resin composition comprises the M-type as the hexagonal ferrite, the M-type is $Ba(Ti_A Co_B Zn_C)_2 Fe_{10}O_{19}$, and conditions of $0.3 \leq A \leq 1.5$, $0.1 \leq B \leq 1.0$, and $0.1 \leq C \leq 0.7$ are satisfied.

7. The resin composition according to claim 4, wherein when the resin composition comprises the Z-type as the hexagonal ferrite, a condition of $0.5 \leq \beta \leq 2.6$ is satisfied, provided that a molar ratio of a Fe component to an M component in the Z-type is represented by Fe component : M component=$24:\beta$.

8. The resin composition according to claim 4, wherein when the resin composition comprises the Z-type as the hexagonal ferrite, the Z-type is $Ba_3Co_D Zn_E Fe_{24}O_{41}$, and conditions of $0.4 \leq D \leq 2.0$ and $0.1 \leq E \leq 1.0$ are satisfied.

9. The resin composition according to claim 4, wherein when the resin composition comprises the Y-type as the hexagonal ferrite, the Y-type is $Ba_2(Zn_F)_2Fe_{12}O_{22}$, and a condition of $0.35 \leq F \leq 1.35$ is satisfied.

10. A sheet comprising the resin composition according to claim 1.

11. An adhesive sheet having an adhesive layer on a surface of the sheet according to claim 10.

12. The sheet according to claim 10, used for absorbing an electromagnetic wave generated from a circuit of an electrical product and electronic equipment.

13. A paint containing the resin composition according to claim 1.

14. A sheet for electromagnetic wave absorption having a layer comprising the paint according to claim 13 on a surface of a sheet of a resin.

* * * * *